(12) United States Patent
Chen et al.

(10) Patent No.: US 10,884,036 B2
(45) Date of Patent: Jan. 5, 2021

(54) ALTERNATING CURRENT LOAD DETECTION CIRCUIT

(71) Applicant: Tyco Electronics (Shanghai) Co. Ltd., Shanghai (CN)

(72) Inventors: Minjie Chen, Shanghai (CN); Mingjie Fan, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 336 days.

(21) Appl. No.: 15/952,611

(22) Filed: Apr. 13, 2018

(65) Prior Publication Data

US 2018/0231591 A1    Aug. 16, 2018

Related U.S. Application Data

(63) Continuation of application No. PCT/IB2016/056106, filed on Oct. 12, 2016.

(30) Foreign Application Priority Data

Oct. 13, 2015   (CN) .......................... 2015 1 0670172

(51) Int. Cl.
*G01R 31/28* (2006.01)
*G01R 19/175* (2006.01)
*G01R 21/133* (2006.01)

(52) U.S. Cl.
CPC ......... *G01R 19/175* (2013.01); *G01R 21/133* (2013.01); *G01R 31/28* (2013.01)

(58) Field of Classification Search
CPC .... G01R 19/175; G01R 21/133; G01R 31/28; G01R 31/00; G01R 17/10; G01R 19/2513
See application file for complete search history.

(56) References Cited

U.S. PATENT DOCUMENTS 6,320,772 B1 * 11/2001 Doyama ............. H02M 1/4208
363/127
8,441,270 B2 * 5/2013 Lee ........................ G09G 3/296
324/713

(Continued)

OTHER PUBLICATIONS

Electronic Project Circuits, available at https://www.eleccircuit.com/mains-voltage-indicator-with-a-led/ on Aug. 25, 2015 (Year: 2015).*

(Continued)

*Primary Examiner* — Daniel R Miller
(74) *Attorney, Agent, or Firm* — Barley Snyder

(57) ABSTRACT

An alternating current load detection circuit comprises a first resistor connected in parallel to a load circuit, a diode full bridge circuit connected in series to the load circuit and the first resistor, a filter capacitor connected in parallel to the diode full bridge circuit, a second resistor, and a photoelectric coupler connected in parallel to the diode full bridge circuit. The photoelectric coupler and the diode full bridge circuit are connected in series and in parallel to the second resistor, respectively. The diode full bridge circuit includes a first diode, a second diode having a positive electrode electrically connected to a negative electrode of the first diode, a third diode having a negative electrode electrically connected to a positive electrode of the first diode, and a fourth diode having a positive electrode electrically connected to a negative electrode of the second diode and a negative electrode electrically connected to a positive electrode of the third diode.

16 Claims, 2 Drawing Sheets

(56) References Cited

U.S. PATENT DOCUMENTS

| | | | |
|---|---|---|---|
| 10,473,727 B2* | 11/2019 | Testin | G01R 31/40 |
| 2009/0001818 A1 | 1/2009 | Iisaka et al. | |
| 2010/0045346 A1 | 2/2010 | Yoshida | |
| 2014/0028354 A1 | 1/2014 | Yao et al. | |
| 2017/0269621 A1* | 9/2017 | Frucht | G01R 19/16538 |

OTHER PUBLICATIONS

Diode Clipping Circuits, available at https://www.electronics-tutorials.ws/diode/diode-clipping-circuits.html on Sep. 18, 2015 (Year: 2015).*
Low cost Multifunction AC detect circuit in Appliance, TE Connectivity, dated Jan. 29, 2013, 29 pages.
PCT Notification of Transmittal of the International Search Report and The Written Opinion of the International Searching Authority, or the Declaration, International Search Report and Written Opinion of the International Searching Authority, dated Jan. 23, 2017, 12 pages.

* cited by examiner

ALTERNATING CURRENT LOAD DETECTION CIRCUIT

CROSS-REFERENCE TO RELATED APPLICATIONS

This application is a continuation of PCT International Application No. PCT/IB2016/056106, filed on Oct. 12, 2016, which claims priority under 35 U.S.C. § 119 to Chinese Patent Application No. 201510670172.4, filed on Oct. 13, 2015.

FIELD OF THE INVENTION

The present invention relates to a detection circuit and, more particularly, to a detection circuit for detecting an alternating current load.

BACKGROUND

Three separate detection circuits are required to detect an alternating current load in a circuit in the prior art. The three separate detection circuits include a zero-cross detection circuit, a switch detection circuit, and a load failure detection circuit. These three separate detection circuits increase the cost of the detection of the load in the circuit and complicate the detection operation.

Further, the load failure detection circuit is commonly connected to a switch in parallel. When the circuit is in operation and the switch is closed, the load failure detection circuit is shorted out by the switch. The load disconnection failure cannot be detected when the load failure detection circuit is shorted. The load failure detection circuit thus cannot detect in real time whether the loads are working properly during operation of the loads, reducing the operation safety of the whole system.

SUMMARY

An alternating current load detection circuit comprises a first resistor connected in parallel to a load circuit, a diode full bridge circuit connected in series to the load circuit and the first resistor, a filter capacitor connected in parallel to the diode full bridge circuit, a second resistor, and a photoelectric coupler connected in parallel to the diode full bridge circuit. The photoelectric coupler and the diode full bridge circuit are connected in series and in parallel to the second resistor, respectively. The diode full bridge circuit includes a first diode, a second diode having a positive electrode electrically connected to a negative electrode of the first diode, a third diode having a negative electrode electrically connected to a positive electrode of the first diode, and a fourth diode having a positive electrode electrically connected to a negative electrode of the second diode and a negative electrode electrically connected to a positive electrode of the third diode.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
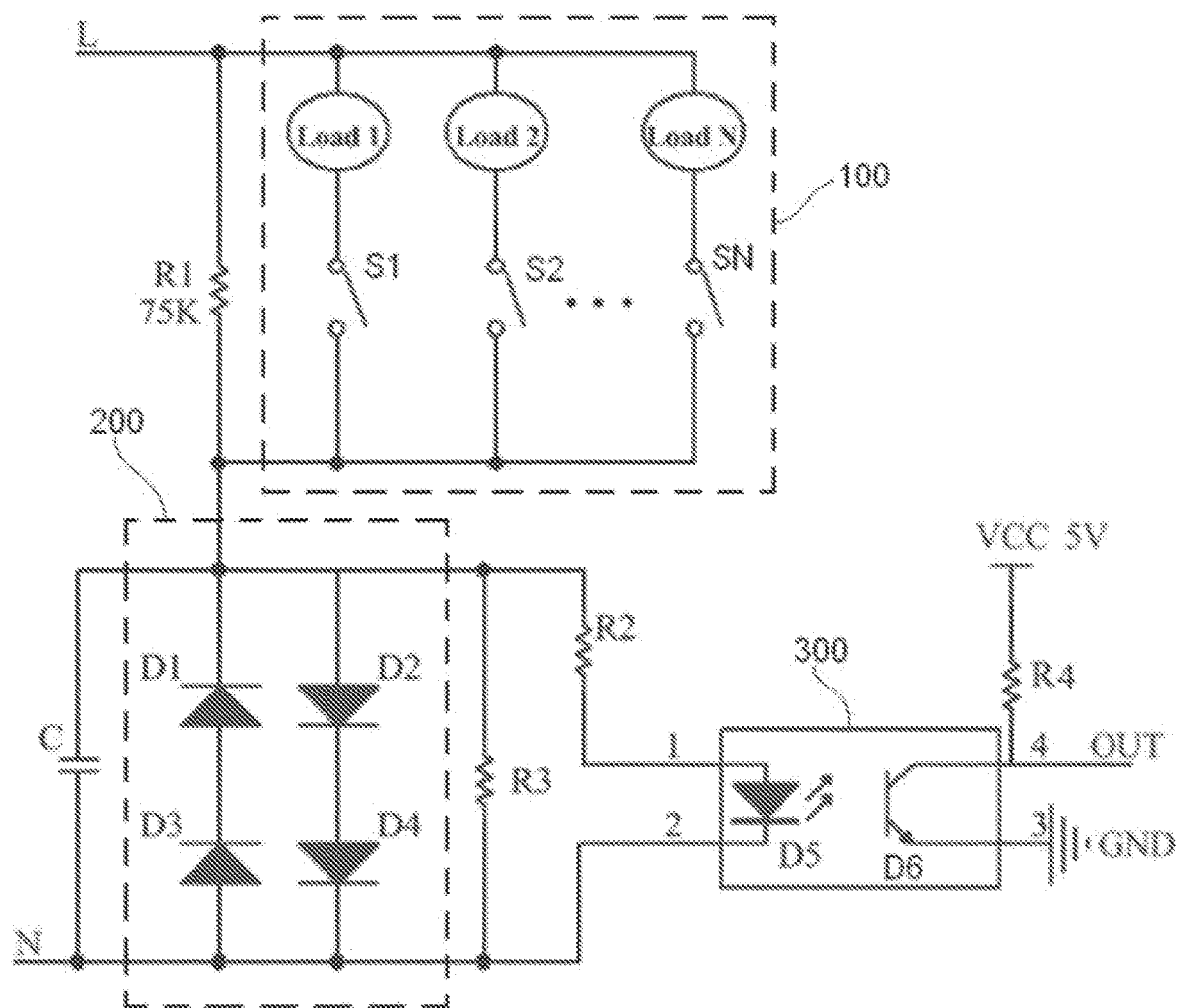
FIG. 1 is a circuit diagram of an alternating current load detection circuit according to an embodiment.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

An alternating current load detection circuit is shown in FIG. 1. The alternating current load detection circuit comprises a first resistor R1, a diode full bridge circuit 200, a filter capacitor C, a photoelectric coupler 300, and a second resistor R2.

The first resistor R1, as shown in FIG. 1, is connected in parallel to a load circuit 100 to be detected. The diode full bridge circuit 200 is connected to the load circuit 100 to be detected and the first resistor R1 in series. The filter capacitor C is connected to the diode full bridge circuit 200 in parallel. The photoelectric coupler 300 is connected to the diode full bridge circuit 200 in parallel and the photoelectric coupler 300 and the diode full bridge circuit 200 are connected to the second resistor R2 in series and in parallel, respectively.

As shown in FIG. 1, the first resistor R1 provides a voltage dividing protection for the diode full bridge circuit 200 and provides an alternating path for zero-cross detection. When the loads are all not connected in the circuit (when S1, S2 . . . SN are switched off), a voltage zero-cross detection circuit consists of the first resistor R1, the second resistor R2 and the photoelectric coupler 300. The first resistor R1 has a relatively large resistance; in the shown embodiment, the first resistor R1 has a resistance of 75 kΩ. The second resistor R2 provides a voltage dividing protection for the photoelectric coupler 300. The second resistor R2 has a relatively small resistance; in an embodiment, the second resistor R2 has a resistance slightly smaller than a resistance of a diode.

The diode full bridge circuit 200, as shown in FIG. 1, includes a first diode D1, a second diode D2, a third diode D3, and a fourth diode D4. A positive electrode of the second diode D2 is electrically connected to a negative electrode of the first diode D1. A negative electrode of the third diode D3 is electrically connected to a positive electrode of the first diode D1. A positive electrode of the fourth diode D4 is electrically connected to a negative electrode of the second diode D2. A negative electrode of the fourth diode D4 is electrically connected to a positive electrode of the third diode D3. The negative electrode of the first diode D1 and the positive electrode of the second diode D2 are electrically connected to a negative electrode of the load circuit 100.

The photoelectric coupler 300 is a common photoelectric coupler having a simple structure with two input ends 1, 2, one ground end 3, and one output end 4 as shown in FIG. 1. A first input end 1 of the photoelectric coupler 300 is electrically connected to a first end of the second resistor R2. A second end of the second resistor R2 opposite the first end is electrically connected to the negative electrode of the first diode D1 and the positive electrode of the second diode D2. A second input end 2 of the photoelectric coupler 300 is electrically connected to the positive electrode of the third diode D3 and the negative electrode of the fourth diode D4.

As shown in FIG. 1, the photoelectric coupler 300 includes a light emitting diode D5 and a photosensitive triode D6. A positive electrode of the light emitting diode D5 is connected to the first input end 1 and a negative electrode of the light emitting diode D5 is connected to the second input end 2. One of a collector and an emitter of the photosensitive triode D6 is connected to the ground end 3 of the photoelectric coupler 300 and the other of the collector and the emitter of the photosensitive triode D6 is electrically connected to a high voltage at the output end 4 of the photoelectric coupler 300.

The light emitting diode D5 is a photovoltaic conversion component for converting electrical energy into optical energy. When a voltage applied to the light emitting diode D5 is larger than a predetermined value, the light emitting diode D5 emits light. The photosensitive triode D6 is a photovoltaic conversion component for converting optical energy into electrical energy. When the light emitting diode D5 emits light, the collector and the emitter of the photosensitive triode D6 are in an on state such that the output end 4 outputs a low voltage. When the light emitting diode D5 doesn't emit light, the collector and the emitter of the photosensitive triode D6 are in an off state such that the output end 4 outputs a high voltage.

As shown in FIG. 1, a first electrode of the filter capacitor C is electrically connected to the negative electrode of the first diode D1 and the positive electrode of the second diode D2. A second electrode of the filter capacitor C opposite the first electrode is electrically connected to the positive electrode of the third diode D3 and the negative electrode of the fourth diode D4. The filter capacitor C is primarily used to filter out spike pulse in the alternating voltage.

The alternating current load detection circuit further comprises a third resistor R3 shown in FIG. 1 connected to the diode full bridge circuit 200 in parallel so as to provide a current dividing protection for the diode full bridge circuit 200. A first end of the third resistor R3 is electrically connected to the negative electrode of the first diode D1 and the positive electrode of the second diode D2. A second end of the third resistor R3 opposite the first end is electrically connected to the positive electrode of the third diode D3 and the negative electrode of the fourth diode D4.

As shown in FIG. 1, a positive electrode of the load circuit 100 is electrically connected to a live wire L of an alternating current supply circuit and is electrically connected to a first end of the first resistor R1. A negative electrode of the load circuit 100 is electrically connected to a second end of the first resistor R1 opposite the first end. The negative electrode of the first diode D1 and the positive electrode of the second diode D2 are electrically connected to the negative electrode of the load circuit 100. The positive electrode of the third diode D3 and the negative electrode of the fourth diode D4 are electrically connected to a neutral wire N of the alternating current supply circuit.

The load circuit 100, as shown in FIG. 1, comprises a plurality of branch load circuits connected to each other in parallel. Each of the branch load circuits includes a load Load 1, Load 2 . . . or Load N and a switch S1, S2 . . . or SN connected to the load Load 1, Load 2 . . . or Load N in series. Each of switches S1, S2 . . . SN is adapted to control on and off states of corresponding Load 1, Load 2 . . . or Load N.

The alternating current load detection circuit shown in FIG. 1 has the functions of zero-cross detection, switch detection, and load failure detection. These functions of the alternating current load detection circuit will now be described in detail with reference to FIGS. 1 and 2.

Figure 2:
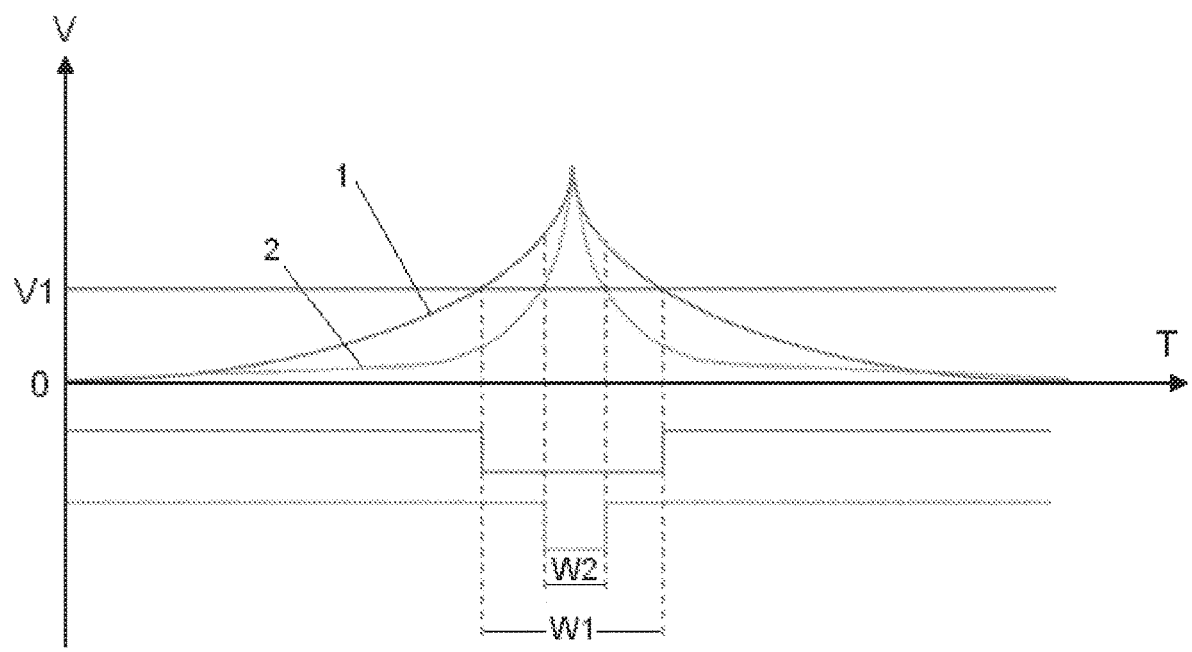
FIG. 2 is graph of an alternating current voltage across a diode full bridge circuit of the alternating current load detection circuit.

When the alternating voltage on the diode full bridge circuit 200 is more than or equal to a predetermined value V1 shown in FIG. 2, the photoelectric coupler 300 is in the on state in which the output end 4 is conducted to the ground end 3 and the output end 4 outputs a low voltage. When the alternating voltage on the diode full bridge circuit 200 is less than the predetermined value V1, the photoelectric coupler 300 is in the off state in which the output end 4 is disconnected from the ground end 3 and the output end 4 outputs a high voltage.

In FIG. 2, the curve 1 depicts the alternating voltage curve across the diode full bridge circuit 200 when the switches S1, S2 . . . SN are all switched off (the loads Load 1, Load 2 . . . or Load N are all not connected in the circuit). The curve 2 is the alternating voltage curve on the diode full bridge circuit 200 when the switches S1, S2 . . . SN are all switched on (the loads Load 1, Load 2 . . . or Load N are all connected in the circuit). W1 depicts a width of a turn-on pulse (the low voltage) of the photoelectric coupler 300 corresponding to the curve 1 when the loads Load 1, Load 2 . . . or Load N are all not connected in the circuit. W2 depicts a width of a turn-on pulse (the low voltage) of the photoelectric coupler 300 corresponding to the curve 2 when the loads Load 1, Load 2 . . . or Load N are all connected in the circuit.

As shown in FIG. 2, after the loads Load 1, Load 2 . . . or Load N are all connected in the circuit, the alternating current flowing through the diode full bridge circuit 200 is increased, a falling edge of the alternating voltage on a diode full bridge circuit 200 becomes steeper, and in turn the width of the turn-on pulse (the low voltage) of the photoelectric coupler 300 narrows. The switch detection and load failure detection are achieved by detecting the change of the width of the turn-on pulse of the photoelectric coupler 300.

When the loads Load 1, Load 2 . . . or Load N are working, if a failure has occurred in a certain load, the width of the turn-on pulse of the photoelectric coupler 300 will be widened, and at this time, it is possible to determine that a failure has occurred in a certain load. Further, every time a switch S1, S2 . . . SN is closed, it narrows the width of the turn-on pulse of the photoelectric coupler 300, and at this time, it is possible to determine that a switch S1, S2 . . . SN has been closed.

In the alternating current load detection circuit, a single detection circuit is used to achieve the functions of zero-cross detection, switch detection, and load failure detection simultaneously, reducing the cost of the alternating current load detection circuit. The alternating current load detection circuit further detects in real time whether the loads Load 1, Load 2 . . . or Load N are working normally during operation of the loads Load 1, Load 2 . . . or Load N, improving the operation safety of the whole load system.

What is claimed is:

1. An alternating current load detection circuit, comprising:
   a first resistor connected in parallel to a load circuit;
   a diode full bridge circuit connected in series to the load circuit and the first resistor, the diode full bridge circuit including:
   a first diode;
   a second diode having a positive electrode electrically connected to a negative electrode of the first diode, the negative electrode of the first diode and the positive electrode of the second diode are electrically connected to the load circuit;
   a third diode having a negative electrode electrically connected to a positive electrode of the first diode; and a fourth diode having a positive electrode electrically connected to a negative electrode of the second diode and a negative electrode electrically connected to a positive electrode of the third diode;

a filter capacitor connected in parallel to the diode full bridge circuit;

a second resistor; and a photoelectric coupler connected in parallel to the diode full bridge circuit, the photoelectric coupler connected in series to the second resistor and the diode full bridge circuit connected in parallel to the second resistor.

2. The alternating current load detection circuit of claim 1, wherein the photoelectric coupler has a first input end, a second input end, a ground end, and an output end.

3. The alternating current load detection circuit of claim 2, wherein the first input end is electrically connected to a first end of the second resistor, and a second end of the second resistor opposite the first end is electrically connected to the negative electrode of the first diode.

4. The alternating current load detection circuit of claim 3, wherein the second input end of the photoelectric coupler is electrically connected to the positive electrode of the third diode.

5. The alternating current load detection circuit of claim 4, wherein the photoelectric coupler includes a light emitting diode and a photosensitive triode.

6. The alternating current load detection circuit of claim 5, wherein the light emitting diode has a positive electrode connected to the first input end of the photoelectric coupler and a negative electrode connected to the second input end of the photoelectric coupler.

7. The alternating current load detection circuit of claim 6, wherein the photosensitive triode has a collector and an emitter, one of the collector and the emitter connected to the ground end of the photoelectric coupler and the other of the collector and the emitter electrically connected to a high voltage at the output end of the photoelectric coupler.

8. The alternating current load detection circuit of claim 4, wherein a first electrode of the filter capacitor is electrically connected to the negative electrode of the first diode and a second electrode of the filter capacitor opposite the first electrode is electrically connected to the positive electrode of the third diode.

9. The alternating current load detection circuit of claim 1, further comprising a third resistor connected in parallel to the diode full bridge circuit.

10. The alternating current load detection circuit of claim 8, wherein a first end of the third resistor is electrically connected to the negative electrode of the first diode and a second end of the third resistor opposite the first end is electrically connected to the positive electrode of the third diode.

11. The alternating current load detection circuit of claim 10, wherein a positive electrode of the load circuit is electrically connected to a live wire of an alternating current supply circuit and a first end of the first resistor.

12. The alternating current load detection circuit of claim 11, wherein a negative electrode of the load circuit is electrically connected to a second end of the first resistor opposite the first end of the first resistor.

13. The alternating current load detection circuit of claim 12, wherein the negative electrode of the first diode is electrically connected to the negative electrode of the load circuit.

14. The alternating current load detection circuit of claim 13, wherein the positive electrode of the third diode is electrically connected to a neutral wire of the alternating current supply circuit.

15. The alternating current load detection circuit of claim 14, wherein the load circuit includes a plurality of branch load circuits connected to each other in parallel.

16. The alternating current load detection circuit of claim 15, wherein each of the branch load circuits includes a load and a switch connected in series to the load.

* * * * *